United States Patent [19]
Abraham et al.

[11] Patent Number: 6,058,676
[45] Date of Patent: May 9, 2000

[54] LID GUIDE FOR ELECTRONIC DEVICES

[75] Inventors: Bruce C. Abraham; James F. Dormer, both of Limekiln; Patrick J. Drummond, Hamburg; Daniel Kern, Sinking Spring, all of Pa.

[73] Assignee: Lucent Technologies Inc., Murray Hill, N.J.

[21] Appl. No.: 09/167,477

[22] Filed: Oct. 7, 1998

[51] Int. Cl.[7] .................................................... B65B 7/28
[52] U.S. Cl. ................................. 53/287; 53/367; 53/390
[58] Field of Search .......................... 53/282, 287, 367, 53/390, 300, 290; 269/21, 40

[56] References Cited

U.S. PATENT DOCUMENTS

| | | | |
|---|---|---|---|
| 514,842 | 2/1894 | Morstadt | 53/390 |
| 803,145 | 10/1905 | Winchester | 53/390 |
| 4,731,979 | 3/1988 | Yamamoto et al. | 53/282 |
| 5,171,398 | 12/1992 | Miyamoto | 269/21 |
| 5,195,729 | 3/1993 | Thomas et al. | 269/21 |
| 5,417,408 | 5/1995 | Ueda | 269/21 |
| 5,671,910 | 9/1997 | Davies et al. | 269/21 |

*Primary Examiner*—John Sipos

[57] ABSTRACT

A lid guide ensures that a lid is accurately positioned and oriented when it is lowered over and placed onto a tray used to hold electronic devices, for example, for transport between different stages in the manufacturing process, thereby helping to prevent damage to the devices that might otherwise result from physical contact with a lid that is placed onto the tray in a haphazard manner. A lid guide may have one or more openings, each of which may be keyed to restrict the tray and the lid to a single rotational orientation. In addition, channels may be provided in opposing walls of each opening in the lid guide to enable a technician to hold either a tray or a lid between a thumb and a finger when placing the tray onto the lid guide or the lid onto the tray.

10 Claims, 3 Drawing Sheets

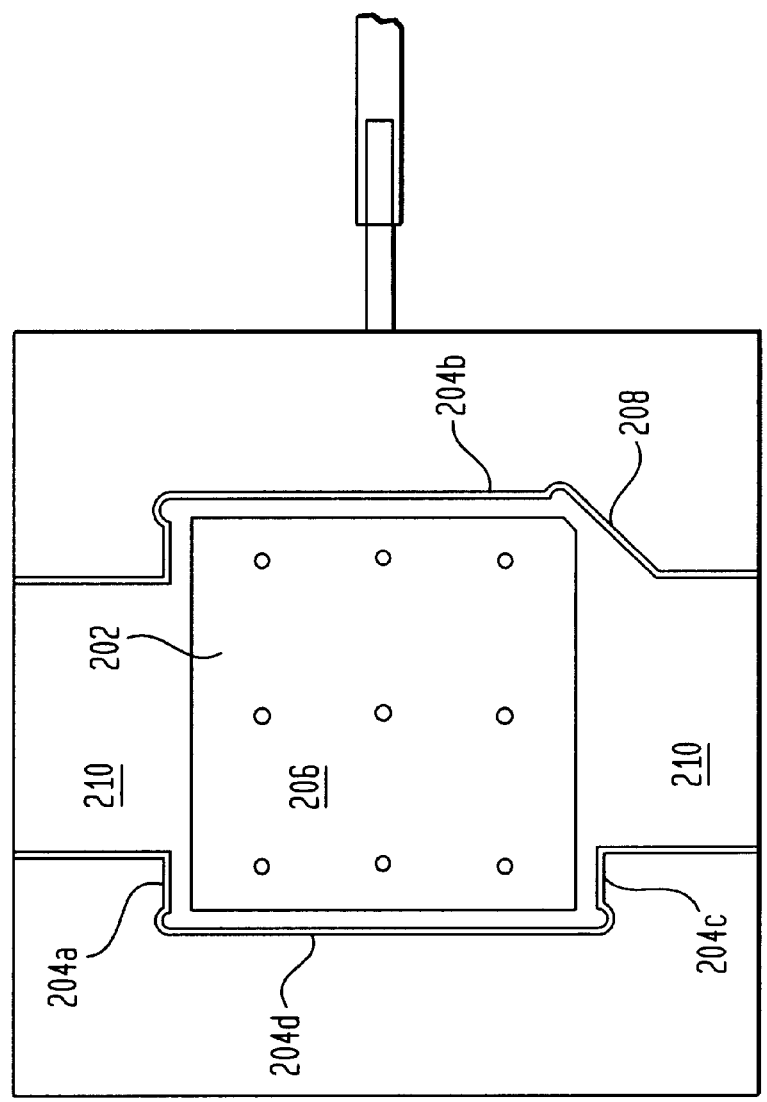
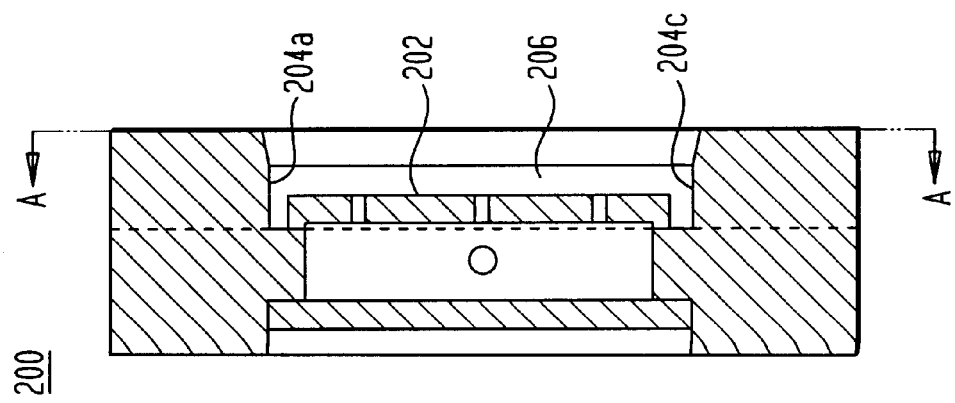

LID GUIDE FOR ELECTRONIC DEVICES

BACKGROUND OF THE INVENTION

1. Field of the Invention

The present invention relates to electronics, and, in particular, to the manufacture and handling of electronic devices, such as optoelectronic and microelectronic sub-assemblies.

2. Description of the Related Art

During the manufacture of certain electronic devices, such as optoelectronic and microelectronic sub-assemblies, trays are used to hold the devices for transport between different stages of manufacturing and testing and for access by machinery that automatically performs particular operations on the devices.

FIG. 1 shows an exploded view of a conventional clamped tray-and-lid assembly 100, used to hold up to 50 optical laser sub-assemblies, a particular type of optoelectronic device. Assembly 100 consists of tray 102, lid 104, and clamp 106. As shown in FIG. 1, tray 102 has a 5×10 array of bins 108, each of which can receive a single device. When the devices are carried from one stage to another during the manufacturing process, lid 104 is placed over tray 102 to keep the devices in place within their individual bins. In order to secure lid 104 onto tray 102, clamp 106 slides over the tray-and-lid assembly formed by tray 102 and lid 104 so that the devices can be safely transported and/or stored. Even after manufacturing of the devices is complete, the devices are transported within clamped tray-and-lid assembly 100 to the next stage in the fabrication process, e.g., mounting each optical laser sub-assembly onto a substrate and/or configuration with other components to form individual optoelectronic packages.

In one embodiment, the lengths and widths of tray 102 and lid 104 are each about 2 inches, and the length and width of each device are each less than 0.2 inches. Unless lid 104 is positioned and oriented accurately over tray 102, some of the devices held by tray 102, especially those lying near the edges of the array, may get damaged when a technician places lid 104 onto tray 102. It is not uncommon for a set of devices to go through the entire manufacturing process with all of the devices in a tray having been tested and qualified as acceptable for a particular application, only to have some of the devices damaged when a technician places a lid over the tray. Such damage might be discovered only after the devices are delivered for electronic packaging, perhaps by a customer, when the lid is removed revealing for the first time the existence of damaged devices.

SUMMARY OF THE INVENTION

The present invention is directed to a technique for placing lids over trays used to hold electronic devices during the manufacturing, testing, and transport of such devices. According to one embodiment, a tray containing devices is placed within a special lid guide that ensures that the lid will be properly positioned and oriented when it is lowered over and placed onto the tray, thereby reducing the likelihood of damage to any of the devices held within the tray. The tray-and-lid assembly may then be removed from the lid guide for clamping and further transporting.

In one embodiment, the present invention is a lid guide, comprising a base and one or more side walls defining an opening adapted to receive a tray used to hold electronic devices and adapted to position and orient a lid as it is lowered over and placed onto the tray, in order to help prevent damage to electronic devices held within the tray.

BRIEF DESCRIPTION OF THE DRAWINGS

Other aspects, features, and advantages of the present invention will become more fully apparent from the following detailed description, the appended claims, and the accompanying drawings in which:

FIGS. 2A and 2B show side and top views, respectively, of a single-tray lid guide, according to one embodiment of the present invention.

DETAILED DESCRIPTION

Figure 1:
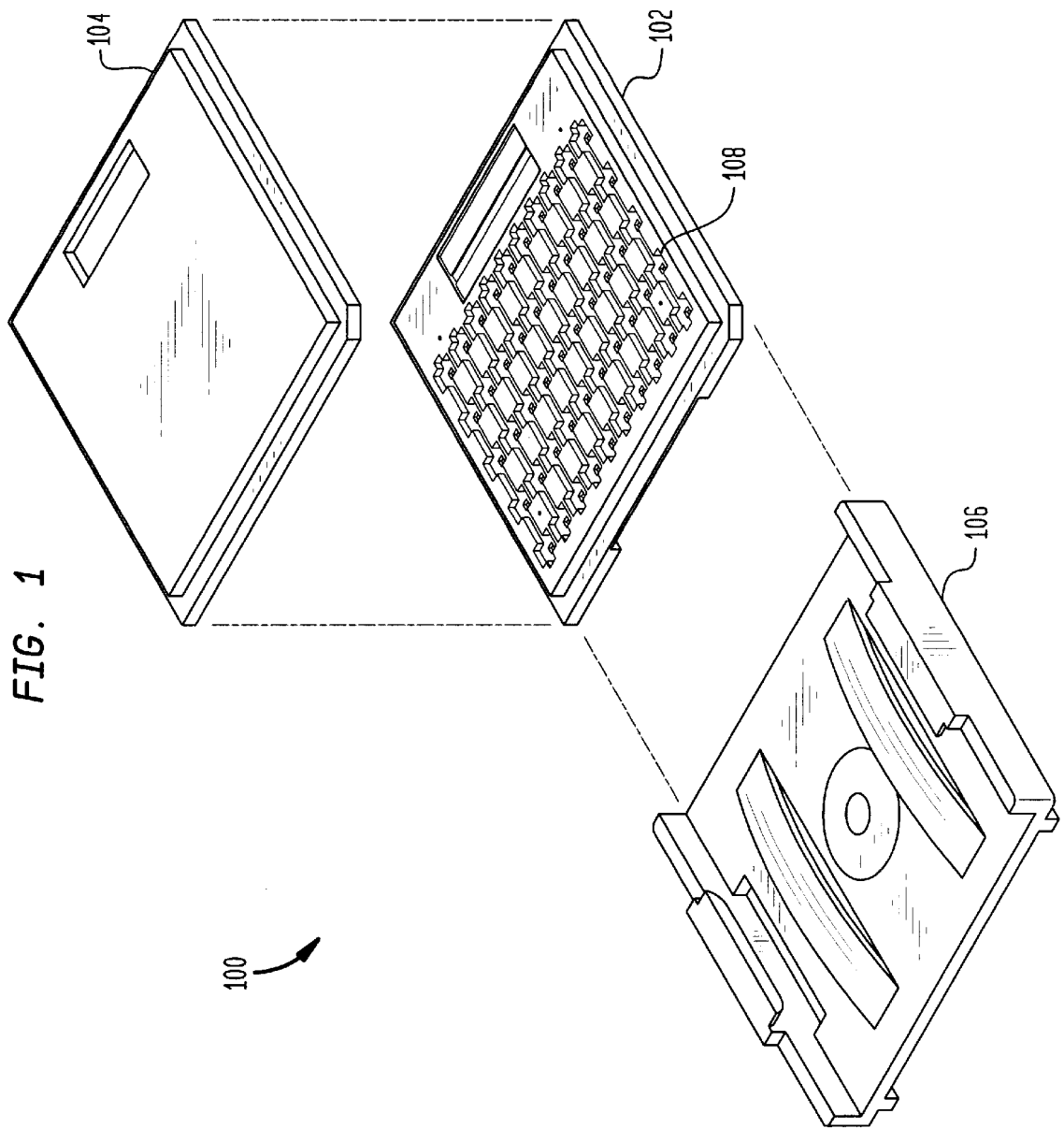
FIG. 1 shows an exploded view of a conventional clamped tray-and-lid assembly used to hold up to 50 optical laser sub-assemblies, a particular type of optoelectronic device.

FIGS. 2A and 2B show side and top views, respectively, a single-tray lid guide 200, according to one embodiment of the present invention. Lid guide 200, which is preferably machined from a single block of material, such as anodized aluminum, has a base 202 and four side walls 204a–d that define an opening 206 having a generally rectangular shape. Opening 206 is designed to receive a tray, such as tray 102 of FIG. 1, and to position and orient a lid, such as lid 104 of FIG. 1, when the lid is lowered over and placed onto the tray. By accurately guiding the lid onto the tray, lid guide 200 helps prevent the lid from damaging any of the devices held within the tray.

Opening 206 has a notch 208 at one corner that conforms to a notch located at one corner of each of tray 102 and lid 104. Notch 208 provides keying that restricts both the tray and the lid to one rotational orientation when placed within lid guide 200. In addition, opposing walls 204a and 204c have channels 210 that enable a technician to hold either a tray or a lid between a finger and a thumb of one hand while lowering the tray or lid onto lid guide 200. This allows the technician to place a tray in the lid guide and a lid onto a tray carefully with a great deal of control.

Figure 3A:
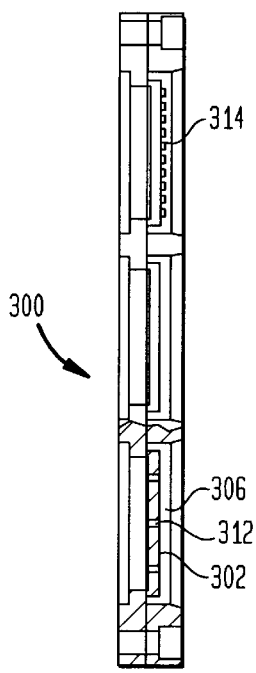
FIGS. 3A–D show side, top, end, and bottom views, respectively, of a multi-tray lid guide, according to another embodiment of the present invention.
Figure 3B:
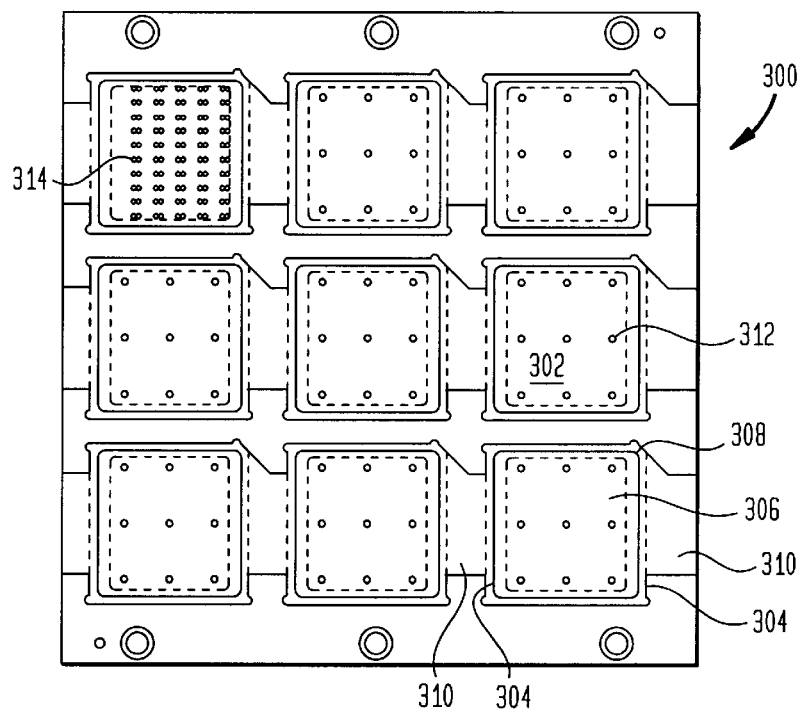
Figure 3C:
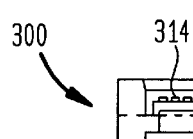
Figure 3D:
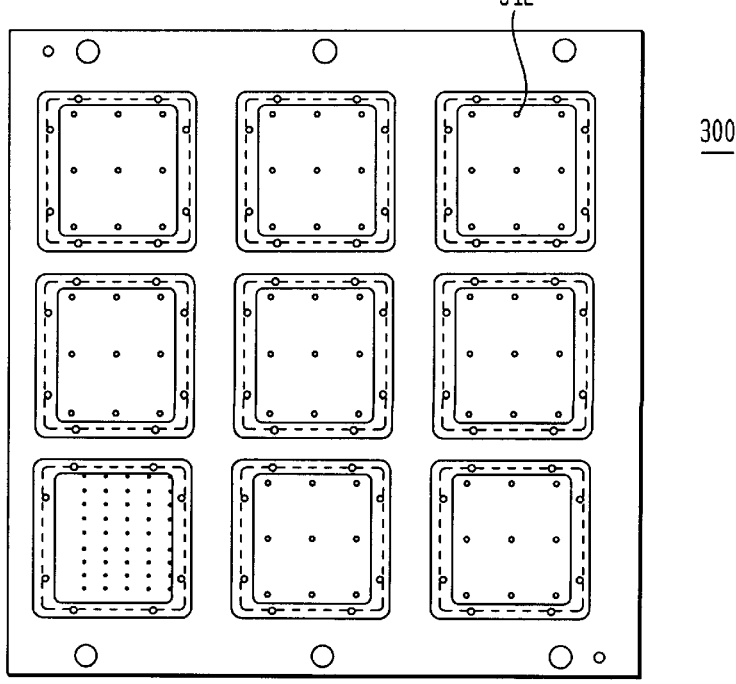

FIGS. 3A–D show side, top, end, and bottom views, respectively, of a multi-tray lid guide 300, according to another embodiment of the present invention. The side view of FIG. 3A and the end view of FIG. 3C are partial cross-sectional views. Lid guide 300 has structure that defines a 3×3 array of openings 306, where each opening 306 is similar to opening 206 in lid guide 200 of FIGS. 2A–B. In particular, each opening 306 has a notch 308 at one corner to provide keying and channels 310 defined in an opposing pair of side walls 304 to provide easy access by a technician.

In addition, for each opening 306, a base 302 has a number of holes 312 that can be connected to a vacuum. As shown in FIG. 1, each bin in the tray has a pinhole through which suction is applied by the vacuum to secure each device within its respective bin. This suction also aids in the transfer of individual devices to and from a vacuum-activated pick-up/deposit tool during certain operations (e.g., sorting). For one opening 306, base 302 also has an array of projections 314, where each projection is positioned to correspond with each location for receiving a device within the tray, wherein each device in the tray rests on one of the projections when the tray is placed in the opening. Each projection 314 preferably has a pinhole for applying suction to the corresponding device.

In one particular application, lid guide 300 can be used with a particular type of machine called an electronic device sorter, where one or more input trays containing electronic devices are placed within some of openings 306 and two or more empty output trays are placed within some of the other openings 306. The input trays are initially placed within openings 306 with lids in place with lid guide 300 guiding them into place. The lids are then removed with lid guide 300 contributing to their safe removal without damaging or disturbing the devices held within the trays. With all of the trays in place within lid guide 300, the sorter picks up one device at a time from an input tray using its pick-up/deposit tool, characterizes the device, for example, under computer control based on experimental results from previous manufacturing stages, and places the device in a particular output tray designated to receive devices having a particular characterization (e.g., devices suitable for a particular application or devices rejected for any and all applications). After sorting is completed and all of the devices originally held in input trays have been placed in appropriate output trays, lids can be safely placed over the output trays without damaging or disturbing any of the sorted devices and the tray-and-lid assemblies can then be carefully removed from lid guide 300 for clamping using a clamp, such as clamp 106 of FIG. 1, for transporting for further processing.

Although the present invention has been described in the context of sorting optical laser sub-assemblies, it will be understood that both the single-tray and the multi-tray lid guides of the present invention can be used in the context of different manufacturing and processing stages and/or different electronic devices, including other optoelectronic and microelectronic sub-assemblies. Moreover, multi-tray guides may have numbers of openings other than nine, and the shape of the openings may be other than generally rectangular.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A lid guide, comprising a base and one or more side walls defining an opening configured to receive a substantially rectangular tray used to hold a plurality of electronic devices and configured to position and orient a substantially rectangular lid as it is lowered over and placed onto the tray, in order to help prevent damage to electronic devices held within the tray, wherein each of an opposing pair of the side walls has a channel to provide access by a technician holding a tray or a lid between a finger and a thumb of one hand while lowering the tray onto the lid guide or the lid onto the tray.

2. The invention of claim 1, wherein the base and the one or more side walls are manufactured from a single block of material.

3. The invention of claim 1, wherein the opening is keyed to restrict reception of the tray to a single rotational orientation.

4. The invention of claim 3, wherein the opening is generally rectangular in shape and the keying comprises a notch at a corner of the opening.

5. The invention of claim 1, wherein the lid guide comprises structure defining an array of openings, each of which is adapted to receive a tray and position and orient a lid.

6. The invention of claim 1, wherein the base comprises one or more holes used to apply a vacuum to secure individual electronic devices within the tray.

7. The invention of claim 1, wherein the base comprises an array of projections, wherein each projection is positioned to correspond with each location for receiving an electronic device within the tray, wherein each electronic device in the tray rests on one of the projections when the tray is placed in the opening.

8. The invention of claim 7, wherein each projection has a pinhole used to apply a vacuum to secure a different electronic device on each projection.

9. The invention of claim 1, wherein:

the lid guide is manufactured from a single block of material; and the lid guide has four side walls defining, with the base, a single opening having a generally rectangular shape with a notch at a corner of the opening to restrict reception of the tray to a single rotational orientation.

10. The invention of claim 1, wherein the lid guide comprises structure defining an array of openings, each of which is defined by a base and four side walls as having a generally rectangular shape with a notch at a corner of the opening to restrict reception of a tray to a single rotational orientation, wherein, for each opening:

the base comprises one or more holes used to apply a vacuum to secure individual electronic devices within the tray; and at least one of the bases comprises an array of projections, wherein each projection is positioned to correspond with each location for receiving an electronic device within the tray, wherein each electronic device in the tray rests on one of the projections when the tray is placed in the opening and each projection has a pinhole used to apply a vacuum to secure a different electronic device on each projection.

* * * * *